United States Patent [19]

Oren et al.

[11] Patent Number: 4,742,022

[45] Date of Patent: May 3, 1988

[54] METHOD OF DIFFUSING ZINC INTO III-V COMPOUND SEMICONDUCTOR MATERIAL

[75] Inventors: Moshe Oren, Wilmington, Del.; A. N. M. Masum Choudhury, Newton, Mass.

[73] Assignee: GTE Laboratories Incorporated, Waltham, Mass.

[21] Appl. No.: 115,021

[22] Filed: Oct. 29, 1987

Related U.S. Application Data

[63] Continuation-in-part of Ser. No. 878,727, Jun. 26, 1986, abandoned.

[51] Int. Cl.⁴ ......................................... H01L 21/223
[52] U.S. Cl. ..................................... 437/167; 437/169
[58] Field of Search ..................... 437/167, 169, 165

[56] References Cited

U.S. PATENT DOCUMENTS

| | | | |
|---|---|---|---|
| 3,139,362 | 6/1964 | D'Asaro et al. | 437/165 |
| 3,485,685 | 12/1969 | Casey, Jr. et al. | 437/167 |
| 3,688,388 | 9/1972 | Dyment et al. | 437/167 |
| 3,713,910 | 1/1973 | Matino | 437/169 X |
| 3,753,808 | 8/1973 | Ono et al. | 437/169 X |
| 3,794,533 | 2/1974 | Adachi et al. | 437/167 X |
| 3,852,129 | 12/1974 | Diguet | 437/167 X |
| 4,592,793 | 6/1986 | Hovel et al. | 437/167 |

Primary Examiner—George T. Ozaki
Attorney, Agent, or Firm—David M. Keay

[57] ABSTRACT

Method of diffusing zinc into gallium arsenide and aluminum gallium arsenide. A wafer of gallium arsenide or aluminum gallium arsenide is placed in close proximity to a quantity of granular zinc gallium arsenide. The assemblage is heated in an open-tube furnace in the presence of flowing nitrogen to vaporize zinc whereby zinc diffuses into the gallium arsenide or aluminum gallium arsenide wafer without eroding the surface.

8 Claims, 2 Drawing Sheets

METHOD OF DIFFUSING ZINC INTO III-V COMPOUND SEMICONDUCTOR MATERIAL

CROSS-REFERENCE TO RELATED APPLICATION

This application is a continuation-in-part of application Ser. No. 878,727, filed June 26, 1986, now abandoned, by Moshe Oren and A.N.M. Masum Choudhury and assigned to the assignee of the present application.

BACKGROUND OF THE INVENTION

This invention relates to semiconductor materials. More particularly, it is concerned with methods of introducing conductivity type imparting material into III-V compound semiconductor materials.

Zinc is often introduced into III-V compound semiconductor materials as an acceptor material which imparts p-type conductivity to the III-V compound semiconductor material. One conventional procedure for diffusing zinc into III-V compound semiconductor materials employs a sealed ampule technique. This method, however, is cumbersome and is not suitable for large-scale production with large wafers of semiconductor material. Open-tube methods have been developed for diffusing zinc into some III-V compound semiconductor materials. In these methods a high zinc vapor pressure is obtained by dissolving zinc in a melt of a material such as tin or gallium or by coating the wafer being processed with a zinc containing oxide. In addition an over-pressure of arsenic is necessary in order to prevent loss of arsenic from the wafer which results in degradation of the wafer surface.

SUMMARY OF THE INVENTION

The improved method of introducing zinc into a body of III-V compound semiconductor material in accordance with the present invention comprises placing a body of gallium arsenide or aluminum gallium arsenide in close proximity to a quantity of zinc gallium arsenide in granular form. The composition of the quantity of zinc gallium arsenide is approximately 22% Zn, 18% Ga, and 60% As in atomic percent. The body of gallium arsenide or aluminum gallium arsenide is placed in an open-tube furnace. The assemblage is heated while flowing an inert gas through the open-tube furnace to vaporize zinc whereby zinc diffuses into the gallium arsenide or aluminum gallium arsenide.

For a better understanding of the present invention, together with other and further objects, advantages, and capabilities thereof, reference is made to the following disclosure and appended claims in connection with the above-described drawings.

DETAILED DESCRIPTION

The present invention is concerned with introducing zinc, a p-type conductivity imparting or acceptor material, into III-V compound semiconductor materials by diffusion. The III-V compound semiconductor materials are gallium arsenide (GaAs) and aluminum gallium arsenide (AlGaAs). These materials may be combined to form heterojunction materials.

A wafer of gallium arsenide or aluminum gallium arsenide is prepared in the usual well-known manner. The source of zinc to be diffused into the wafer is zinc gallium arsenide in granular form. The wafer is placed in close proximity to, but spaced from, a quantity of granular zinc gallium arsenide, and the assemblage is placed in an oven with continuous flow of inert gas and heated to vaporize the zinc. The zinc diffuses into the III-V compound semiconductor material of the wafer with no significant erosion of the wafer due to arsenic evaporation from the wafer surface.

Figure 1:
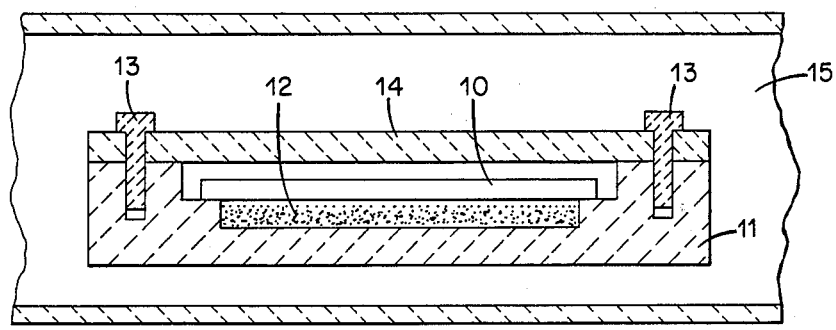
FIG. 1 is a representation in cross-section illustrating the assemblage of parts during the diffusion method in accordance with the present invention.

FIG. 1 depicts the arrangement of various parts and materials for the heat treatment. The wafer 10 of gallium arsenide or aluminum gallium arsenide is placed on a shelf in a graphite boat 11. A quantity of zinc gallium arsenide 12 is placed in a recess in the lower portion of the graphite boat 11 so as to be in close proximity to, but not in contact with, the wafer 10. A graphite cover 14 is placed over the graphite boat 11 and held in place by graphite screws 13. The assemblage is placed in a conventional open-tube quartz furnace 15 while an inert gas is flowed through the furnace 15. During heating zinc vaporizes from the zinc gallium arsenide 12.

Wafers of single crystal semi-insulating gallium arsenide (GaAs) and aluminum gallium arsenide (AlGaAs) were placed in graphite boats with a flat planar surface facing in close proximity to, but not in contact with, zinc gallium arsenide (ZnGaAs) in granular form. The quantity of ZnGaAs granules was substantially uniformly spaced from the surface of the wafer by approximately 1 mm. The zinc gallium arsenide employed was Puratronic zinc gallium arsenide 20% by weight zinc, produced by Johnson Matthey Chemicals Limited, Orchard Road, Royston, Herts., England. The composition of this material was determined by chemical analysis to be 22% Zn, 18% Ga, and 60% As in atomic percentage.

For each diffusion procedure the graphite boat was placed in an open-tube furnace under continuous flow of high-purity nitrogen. The assemblages were heated at temperatures between 500° C. and 650° C. for periods of from 15 minutes to 6 hours-15 minutes. The actual temperatures and times of heating were varied depending upon the particular diffusion depth of zinc desired.

Zinc may be diffused into a wafer at an entire surface of the wafer. Alternatively, zinc may be selectively diffused at portions of the surface of the wafer by protecting portions of the surface not to be diffused with a thin layer of a suitable masking material during the diffusion. More specifically, a coating of silicon nitride is deposited on the surface of the wafer and a portion selectively removed by employing known techniques in order to expose surface areas of the wafer into which the zinc is to be diffused. The wafer is placed in the boat with the coated surface facing the source of zinc. Those regions of the surface covered by the masking material are protected from the zinc during the diffusion treatment.

Figure 2:
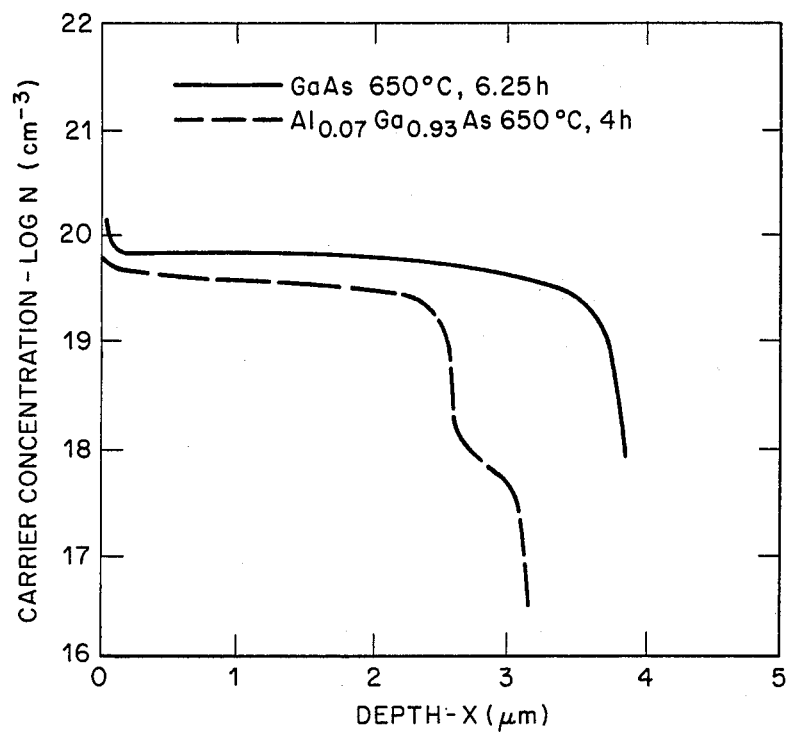
FIG. 2 illustrates graphs of carrier concentration profile for gallium arsenide wafers and aluminum gallium arsenide wafers diffused with zinc in accordance with the method of the invention.

FIG. 2 illustrates carrier concentration profiles for GaAs and for $Al_{0.07}Ga_{0.93}As$ which were treated at temperatures of 650° C. for 6.25 and 4 hours, respectively. For both wafers the profiles of zinc diffusion are relatively flat and drop off sharply at the leading edge of the diffusion by about two orders of magnitude within a range of 200 nm.

Figure 3:
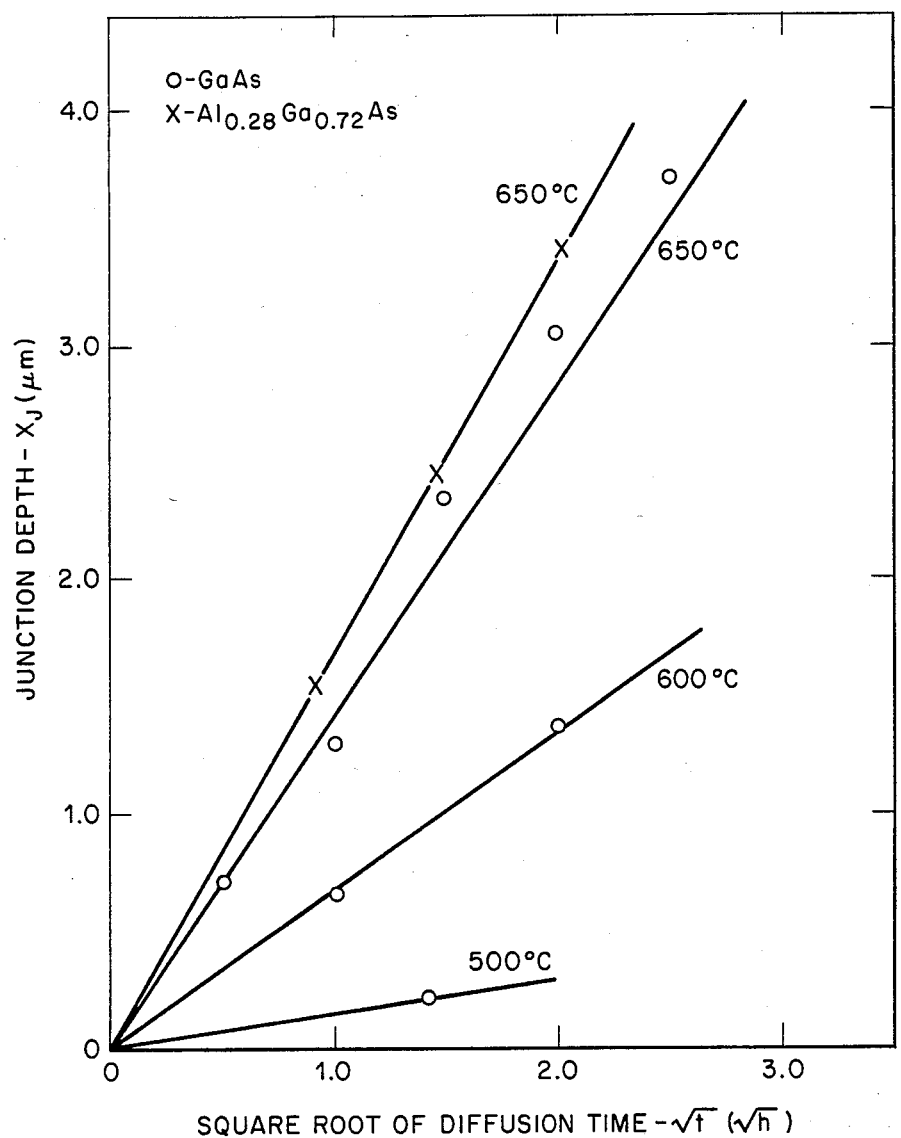
FIG. 3 illustrates several graphs of junction depth versus the square root of diffusion time as a function of various temperatures of diffusion for gallium arsenide and aluminum gallium arsenide treated in accordance with the method of the present invention.

FIG. 3 shows a set of graphs illustrating the relationship between the junction depth ($X_J$) and the square root of the diffusion time ($\sqrt{t}$) at various diffusion temperatures for both GaAs and AlGaAs. The linear dependence between $X_J$ and $\sqrt{t}$ as illustrated by the curves of FIG. 3 indicates that the quantity of ZnGaAs serves as an infinite source of zinc and is not depleted during the diffusion. At 650° C. the slope of $X_J$ versus $\sqrt{t}$, commonly known as the diffusion rate, is 1.43 $\mu m/h^{\frac{1}{2}}$ for GaAs and 1.69 $\mu m/h^{\frac{1}{2}}$ for $Al_{0.28}Ga_{0.72}As$.

The method as described provides for the open-tube diffusion of zinc into gallium arsenide and aluminum gallium arsenide wafers without degradation of the surface by erosion of arsenic. The p-type layers obtained by the method are of high quality and thus are suitable for the fabrication of semiconductor devices, such as solar cells and junction field effect transistors.

While there have been shown and described what are considered preferred embodiments of the present invention, it will be obvious to those skilled in the art that various changes and modifications may be made therein without departing from the invention as defined by the appended claims.

What is claimed is:

1. The method of introducing zinc into a body of gallium arsenide or aluminum gallium arsenide comprising placing a body of gallium arsenide or aluminum gallium arsenide in close proximity to a quantity of zinc gallium arsenide in granular form; the composition of the quantity of zinc gallium arsenide being approximately 22% Zn, 18% Ga, and 60% As in atomic percent;

placing said body and zinc gallium arsenide in an open-tube furnace; and heating while flowing an inert gas through the open-tube furnace to vaporize zinc whereby zinc diffuses into the gallium arsenide or aluminum gallium arsenide.

2. The method in accordance with claim 1 wherein heating comprises heating at a temperature of between 500° C. and 650° C. for a period of from 15 minutes to 6 hours - 15 minutes.

3. The method in accordance with claim 2 wherein said inert gas is nitrogen.

4. The method of introducing zinc into a wafer of gallium arsenide or aluminum gallium arsenide comprising placing a wafer of gallium arsenide or aluminum gallium arsenide and a quantity of zinc gallium arsenide in granular form in a boat with a planar surface of the wafer facing, in close proximity to, and substantially uniformly spaced from the quantity of zinc gallium arsenide; the composition of the quantity of zinc gallium arsenide being approximately 22% Zn, 18% Ga, and 60% As in atomic percent;

placing the boat containing the wafer of gallium arsenide or aluminum gallium arsenide in an open-tube furnace; and heating while flowing an inert gas through the open-tube furnace to vaporize zinc whereby zinc diffuses into the wafer of gallium arsenide or aluminum gallium arsenide.

5. The method in accordance with claim 4 wherein heating comprises heating at a temperature of between 500° C. and 650° C. for a period for from 15 minutes to 6 hours - 15 minutes.

6. The method in accordance with claim 5 wherein said inert gas is nitrogen.

7. The method in accordance with claim 6 wherein said surface of the wafer of gallium arsenide or aluminum gallium arsenide is separated from the quantity of aluminum gallium arsenide by approximately one millimeter while heating in the open-tube furnace.

8. The method in accordance with claim 7 including forming a coating of a masking material in a predetermined pattern on said surface of said wafer of gallium arsenide or aluminum gallium arsenide prior to placing the wafer in close proximity to said quantity of zinc gallium arsenide; and placing the wafer with said coating facing said quantity of zinc gallium arsenide whereby zinc diffuses into said wafer at the portion of the surface not coated with masking material.

* * * * *